United States Patent [19]

Maxfield et al.

[11] Patent Number: 4,939,308
[45] Date of Patent: Jul. 3, 1990

[54] METHOD OF FORMING CRYSTALLITE-ORIENTED SUPERCONDUCTING CERAMICS BY ELECTRODEPOSITION AND THIN FILM SUPERCONDUCTING CERAMIC MADE THEREBY

[75] Inventors: MacRae Maxfield, Plainfield; Ray H. Baughman, Morris Plains; Zafar Iqbal, Morristown; Helmut Eckhardt, Madison, all of N.J.

[73] Assignee: Allied-Signal Inc., Morris Township, Morris County, N.J.

[21] Appl. No.: 197,248

[22] Filed: May 20, 1988

Related U.S. Application Data

[63] Continuation-in-part of Ser. No. 188,019, Apr. 29, 1988, Pat. No. 4,870,051.

[51] Int. Cl.$^5$ .......................... C23C 14/34; B05D 5/12
[52] U.S. Cl. .......................... 505/1; 156/603; 156/610; 204/192.17; 204/192.24; 420/901; 427/62; 428/930; 505/729; 505/736
[58] Field of Search .................. 156/600, 603, 610; 427/62; 204/192.17, 192.24, 61; 505/1, 736; 420/901

[56] References Cited

U.S. PATENT DOCUMENTS 4,826,808  5/1989  Yurek et al. .................. 428/930

OTHER PUBLICATIONS

Chaudhari et al., Phys. Rev. Letts., 58 (Jun. 1987) 2684.
Jin et al., Appl. Phys. Letts., 51 (Sep. 1987) 943.
Hammon et al., Extended Abstract MRS–Spring Meeting, Annaheim, Calif., 1987, p. 169.
Wu et al., Appl. Phys. Letts, 51 (Sep. 1987) 861.
Laurent et al., Appl. Phys. Letts., 52 (Apr. 1988) 1179.
Manklewich et al, MRS–Symp. Proc. #99, Nov. 1987, p. 119.
Laibowitz, AIP–Conf. Proc. #165, Nov. 1987, p. 2.
Chang et al., Appl. Phys. Letts., 52 (Jan. 1988) 72.
Yurek et al., M.R.S. Symp. Proc. #99, Nov. 1987, p. 619.
Jin et al., Ibid, Nov. 1987, p. 773.
Maeda et al., Physica, C 153–155, 1988, p. 602.
Chu et al., Physica C153–155, 1988, 1138.
Laibowitz et al., Phys. Rev. B 35 (1987) 8821.
Yurek et al., Met. Trans. A 18 (1987) 1813.
Shah et al., Materials Letts. 6 (Dec. 1987) 49.
Park et al. in MRS. Symp. Proc. #99, Dec. 1987, ed. Brodsky, Pittsburgh, Pa., p. 685.
Cohen, U., Jour. Crystal Growth 46 (1979) 146.
De Mattei et al., Jour. Crystal Growth 44 (1978) 545.
Pinkerton et al., Appl. Phys. Letts. 53 (1988), 438.

Primary Examiner—Upendra Roy
Attorney, Agent, or Firm—Gerhard H. Fuchs; Richard C. Stewart; Ernest D. Buff

[57] ABSTRACT

The invention relates to an improvement in a method of forming deposits of superconducting ceramics. Generally, such ceramics are formed by electrodepositing a mixture of metals of the type and in proportions sufficient to be oxidized into ceramic; oxidizing the electrodeposited mixture under conditions sufficient to result in a superconducting ceramic deposit; and orienting the crystallites in said superconducting ceramic deposit. Crystallite orientation may take place before, after or during the oxidation step.

11 Claims, 4 Drawing Sheets $EuBa_2Cu_3O_x$ Film On Pt

METHOD OF FORMING CRYSTALLITE-ORIENTED SUPERCONDUCTING CERAMICS BY ELECTRODEPOSITION AND THIN FILM SUPERCONDUCTING CERAMIC MADE THEREBY

CROSS-REFERENCE TO RELATED APPLICATIONS

This application is a continuation-in-part of commonly assigned U.S. Appl. Ser. No. 188,019 filed Apr. 29, 1988, now U.S. Pat. No. 4,870,051.

BACKGROUND OF THE INVENTION

This invention relates to a method of forming crystallite-oriented films, thin films or other like deposits of superconducting ceramics and the crystallite-oriented superconducting ceramic films made by the method. More particularly, the method involves electrodeposition of a mixture of metals of the type and in a proportion sufficient to be oxidized into a superconducting ceramic, followed by oxidizing the electrodeposited mixture of metals to form the superconducting ceramic film. Crystallite orientation is achieved in the electrodeposition or oxidation steps, or by means of a separate treatment of the electrochemically deposited metal layer or of the ceramic film.

Superconducting materials have been known since 1911. However, the synthesis of superconductors having relatively high transition temperatures above 30° K. is a quite recent development. By superconductors we herein mean such high transition temperature superconductors.

One class of these superconductors has been found to be superconducting near 90° K. and has been identified as an oxygen deficient perovskite corresponding to the general composition $MBa_2Cu_3O_y$ (referred to hereinafter as the 1-2-3 material), where M is La, Y, Sm, Eu, Gd, Tb, Dy, Ho, Er, Tm, Yb, Lu or Th or combinations of these elements. Two sub-classes of the 1-2-3 materials are: (a) an oxygen-reduced form, with an oxygen content of about y TM 6.7, which has a transition temperature (Tc) of about 60 K, and (b) a doped form referred to sometimes as the 3-3-6 structure of general formula $M(Ba_{2-x}M_x)Cu_3O_{7+\delta}$ in which M=Y, La, Sm, Eu, Gd, Tb, Dy, Ho. Er, Tm, Yb, Lu or Th, where $T_c$ ranges from 0 to about 60 K depending on x and annealing conditions. A second independent class with a Tc of between 20 and 40 K consists of perovskite materials of composition corresponding to $La_{2-x}M_xCuO_4$, where M is Sr, Ba or Ca. These materials have been characterized by a variety of techniques (Extended Abstracts of the Materials Research Society Spring Meeting, Anaheim, California, 1987 and "High Temperature Superconductors", Materials Research Society Symposium Proceedings, Vol. 99 (1988)). More recently Bi and Tl containing compositions and phases such as $Bi_2Sr_2Ca_1Cu_2O_8$ and $Tl_2Ba_2Ca_1Cu_2O_8$, superconducting near 90K and 108K respectively, and a $Tl_2Ba_2Ca_2Cu_3O_{10}$, phase superconducting near 127K, (Proceedings of Conference on Materials and Mechanisms of High $T_c$ Superconductivity, Interlaken, Switzerland, 1988, to be published in Physica B.) have been identified.

Crystallite orientation of high $T_c$ ceramic superconductors increases the critical current density (Applied Physics Letters 52, 1179 (1988)). High current densities are required for applications such as superconducting motors, generators, and magnets. Much higher critical current densities ($10^6 A$ $cm^{-2}$ at 77K for $YBa_2Cu_3O_x$) are obtained (Materials Research Society Proceedings 99, 119 (1988)) for crystallite-oriented films than are obtained for the corresponding crystallite-unoriented bulk superconductor at the same temperature ($10-10^3$ A $cm^{-2}$). Crystallite orientation can also be important for improving the mechanical and thermal durability of the superconducting films, which are typically subjected to both large temperature changes and high mechanical stresses during applications.

Prior art methods of manufacturing superconducting compositions involve mixing together amounts of compounds having the desired metals in ratios as they are found in superconducting compounds, treating the resultant mixture in a complex series of steps, followed by firing in an oven to oxidatively form the superconducting ceramic composition (Extended Abstracts of the Materials Research Society Symposium, Anaheim, Calif., 1987). The resultant products are typically in powder form and, thus, are not readily usable in practical applications.

Other exemplary prior art methods of making the superconducting ceramics involve forming a melt of the metal mixture and firing it in an oxidizing atmosphere: and the depositing an organometallic precursor from solutions followed by a firing in an oxidizing atmosphere ("High Temperature Superconductors", Materials Research Society, Symposium Proceedings, Vol. 99 (1988)). Processes in which the superconductor results from direct oxidation of salt or organometallic precursors have the disadvantage of potential incorporation of elements, such as carbon, from the precursors, which can degrade superconducting properties.

A further prior art method for making ceramic superconductors such as the 1-2-3 phase in a useable form involves chemical vapor deposition of the metals, followed by oxidation of the deposit into a ceramic film. This technique however, is complicated, and precision deposition on desired areas or on desired paths has not yet been achieved. Moreover, the deposition technique is complicated, requires high vacuum and high deposition temperatures. ("Thin Film Processing and Characterization of High Temperature Superconductors", No. 165, American Vacuum Society Series, editors J. M. E. Harper, R. J. Colton and L. C. Feldman, 1988). These complications are avoided by the herein described method.

Electrochemical techniques have heretofore been used to electrochemically vary the oxygen content of certain high temperature superconductors, ("High Temperature Superconductors", Materials Research Society, Symposium Proceedings, Vol. 99 (1988)). We are not aware of any prior art for electrochemically forming combinations of metals that are precursors to high temperature superconductors, nor of electrochemical formation of combinations of metals similar to those found in high temperature superconductors. We have found no disclosure of methods for making crystallite oriented films of ceramic superconductors based on electrochemically deposited metal precursors.

In particular, we are not aware of any precedent for codeposition of metals whose deposition potentials differ by as much as 3 V and, therefore, whose deposition rates and characteristics would be expected to differ substantially.

Those of ordinary skill in this art would not codeposit the combinations of metals found in high temperature ceramic superconductors by conventional electrodeposition methods because such combinations comprise one or more metals whose deposition from an electrolyte requires a highly cathodic potential. The aqueous electrolytes conventionally used in electrodeposition are reactive with materials having such highly cathodic reduction potentials at these potential levels. Thus, one would expect that such metals having highly negative reduction potentials would not effectively deposit on the substrate. By cathodic potential is meant a potential which allows electrons to be liberated, e.g., from an electrode to reduce the charge of a species in an electrolyte. By highly reducing potential is meant that which is substantially negative of the potential at which $H^+$ is reduced to $\frac{1}{2} H_2$ as at a normal hydrogen electrode (NHE). For example, each presently known precursor combination includes one or more metals that can be deposited only at potentials of more than 2V cathodic (negative) of NHE (e.g., $Ca^{+2}$ at potentials $<-2.76$ V vs normal hydrogen electrode, $Sr^{+2}$ at $<-2.89$ V, $Ba^{+2}$ at $<-2.90$ V, $Y^{+3}$ at $<-2.37$V). For comparison, copper, which is typically also required for formation of the high transition temperature superconductors, has a much more positive reduction potential for $Cu^{+2}$ of $+0.34$ eV.

SUMMARY OF THE INVENTION

The present invention provides a method of forming crystallite-oriented deposits of superconducting ceramics by (a) electrodepositing a mixture of metals onto a substrate to form thereon a layer of metals of the type and in proportions sufficient to be oxidized into superconducting ceramic: (b) oxidizing the electrodeposited mixture of metals by subjecting it at elevated temperature to an oxidizing atmosphere under conditions sufficient to result in a superconducting ceramic deposit: and (c) orienting the crystallites in said superconducting ceramic deposit, whereby there is obtained an increase in the critical current density of the superconducting ceramic. Crystallite orientation may be achieved prior to, in the course of, or following the oxidation step.

In general, the critical current density is obtained for a bar-shaped sample of known dimensions using the four probe AC or DC current method of measuring resistance. When the sample goes superconducting at $T_c$, the resistance drops to zero for a known applied current and magnetic field. The current density needed to make the sample non-superconducting again at a particular temperature and magnetic field below $T_c$ is the critical current density at that temperature and magnetic field. Detailed procedures for determining critical current density are familiar to those skilled in the art.

The electrodeposition step involves applying a reducing potential to a conductive substrate while it is in contact with an appropriate electrolyte into which there is immersed a counter-electrode and, if desired, other auxiliary electrodes.

The electrodeposition can be conducted from an electrolyte containing salts of all of the metals in the mixture of metals to be deposited. Alternately, one or more of these metals can be included in the composition of a counterelectrode. Metals deposited from the electrolyte may include, but are not limited to M TM La, Y, Sm, Eu, Gd, Tb, Dy, Ho, Er, Tm, Yb, Lu, Th, Ba, Bi, Tl, Sr, Ca, and Cu, in combination and proportions elected to form superconducting ceramics by oxidation. The preferred specific metals and their proportions are known (Extended Abstracts of the Materials Research Society Spring Meeting in Anaheim, California, 1987). Other metals which functionally behave in the same manner can be substituted for the above, as will be readily apparent to those of ordinary skill in this art. Preferred metal compositions for electrochemical deposition and subsequent oxidation to the superconducting ceramic are those which are miscible, since miscibility enhances both the homogeneity of the superconductor product and processes for obtaining crystallite orientation. Whether or not miscibility exists is either known or readily determined by simple, routine experiment for any metal system of interest here. Components which do not comprise part of a superconducting ceramic may be codeposited, e.g. for the purpose of imparting enhanced mechanical properties. Preferred elements for imparting improved mechanical properties are metals, such as silver, which do not substantially oxidize during formation of the superconductor.

Salts employed for the electrodeposition step must have sufficient solubility in the electrolyte medium. Exemplary salts include $Y(NO_3)_3$, $Ba(PF_6)_2$, and $Cu(OCOCH_3)_2$. The electrolyte medium containing the salts may be an aprotic liquid, i.e., a liquid containing minimal acidic protons, such as dimethylsulfoxide (DMSO), dimethylformamide (DMF), dimethoxyethane (DME), tetrahydrofuran (THF), and the like. Such electrolyte media may contain, in addition, wetting, complexing, or other agents that impart control over composition or morphology of the deposit. Some water may also be included in the electrolyte in order to achieve in some instances the desired conductivity and solubility of the given salt. The water content would not be allowed to exceed that which would be coordinated with the dissolved ions. Such liquids with minimal or no water are referred to as aprotic liquids. In addition, the electrolyte medium may be an ion-conducting polymer, such as salt-containing polyethylene oxide, or a fused salt or fused salt mixture.

The potential applied to the substrate should be sufficient to reduce cations of each salt in the electrolyte to its neutral oxidation state. It should, therefore, be sufficiently cathodic (i.e., at a suitably reducing potential) to reduce the cation having the most negative reduction potential of the mixture. For example, codeposition from an electrolyte containing salts of Eu, Ba, and Cu, requires the application of potential $<-2.89$ V against a NHE in order to reduce $Ba(+2)$ to $Ba(0)$ (standard reduction potential $-2.89$ V) as well as $Cu(+2)$ to $Cu(0)$ ($+0.34$ V), and $Eu(+3)$ to $Eu(0)$ ($-2.37$ V). The applied potential may be varied with time, pulsed, or periodically reversed in order to regulate deposition current, electrolyte composition, and deposit nucleation.

According to the method of this invention, the mixture of metals is electrodeposited onto a substrate which is electrically conductive and not harmful to the resultant ceramic. Electrode substrate materials may be metallic, semiconductive, or photoconductive. They may be free standing such as conductive plates, rods, wires, fibers, and foils, or supported by structural material such as conductive thin films of metals, conductive oxides, and semiconductors coated on quartz and ceramics. The electrode substrates may be virtually any size, shape, and number as long as the electrolyte in contact with the surfaces to be coated is also in contact with a counter electrode. The electrode substrate can consist of or include a metal or metal containing composition which reacts with the electrodeposited metal during oxidation to form the superconductor. For some applications it is desirable to utilize the electrode substrate as the sole source of one of the metals required for formation of the superconductor. This requires interdiffusion of substrate and deposited metals. For purposes of such interdiffusion, post-deposition thermal annealing is useful. A preferred example is electrodeposition of all the metals in the superconductor except for copper onto a low denier copper wire or thin copper foil. Oxidation of the substrate containing electrodeposited metals then yields the superconductor in wire or foil form. For the purpose of obtaining oriented growth of the superconductor phase, and thereby obtaining enhanced critical currents, substrate electrode geometries which provide preferential crystal growth directions can be used. One such convenient substrate electrode geometry is obtained by grooving the electrode surface with parallel lines The substrate material can also be chosen as one which will disappear via sublimation or gasification under the oxidation conditions, so as to result in a substrate-free superconductor.

The counter electrode and other auxiliary electrodes useful in this method are electrically conductive solids such as metals, semiconductors, and photoconductors. They may be inert or electroactive under the conditions of electrodeposition. Those that are electroactive may be useful as sources to the electrolyte of cations of metals being deposited. Counter electrodes with high electrical conductivities (above 100 S/cm) are preferred in order to minimize resistive energy losses during electroplating.

The electrodeposition of the metal mixtures may be performed in seconds to several hours, depending on the deposition current which may range from about $10^{-3}$ to about $10^{+3}$ mA/cm$^2$ of substrate area. The preferred current for deposition from aprotic liquid electrolytes is from about $10^{-2}$ to about 10 mA/cm$^2$. The film thicknesses may range from about $10^{-2}$ to about $10^{+3}$ micron or more. The preferred film thicknesses range from about $10^{-1}$ to about 100 micron. Electrodeposition of precursor metal mixtures must be conducted at temperatures wherein the electrolyte is ionically conductive. Electrodeposition in aprotic liquid electrolytes is conducted, generally, at temperatures between about $-40°$ and about $+200°$ C. The preferred temperature range for using aprotic liquid electrolytes is from about $0°$ to about $100°$ C. Solid polymer electrolytes are generally useful between about $60°$ and about $300°$ C., and fused salt electrolytes are generally useful between about $200°$ and about $500°$ C. Due to higher obtainable conductivities, aprotic liquid electrolytes and fused salt electrolytes are preferred over solid polymer electrolytes. Due to convenient operation near room temperature, aprotic liquid electrolytes are most preferred.

The compositions of deposited mixtures are generally dictated by deposition currents of the individual species at a given applied potential, relative salt concentrations in the electrolyte, and total salt concentration. In the case of aprotic liquid electrolytes, applied potentials are confined to those that are sufficient to deposit all desired species but not so highly cathodic as to harm the deposit through decomposition of the electrolyte. Relative deposition currents of the individual species, which may differ greatly for a given mixture, are, therefore, similarly restricted. In addition, total salt concentration is restricted by solubilities in a given electrolyte medium. Adjustments to salt concentrations in the electrolyte are, however, effective in obtaining desired deposit compositions. This method, therefore, includes a process for establishing the dependence of deposit composition on relative salt concentrations known to those of ordinary skill in the art. For example, at an applied potential of $-5V$ (vs Ag/Ag.) and a total salt concentration of 0.1 M in DMSO, Y—Ba—Cu in the deposit varied according to relative cation concentrations as follows:

| Composite Y—Ba—Cu | | | Electrolyte $Y^{+3}$—$Ba^{+2}$—$Cu^{+2}$ | | |
|---|---|---|---|---|---|
| 1 | 1.1 | 9.7 | 1 | 2 | 1 |
| 1 | 1.4 | 3.1 | 1 | 2 | 0.5 |
| 1 | 1.8 | 3.4 | 1 | 2.8 | 0.5 |

Development of preferred alignment of the high $T_c$ ceramics increases the critical current density (Applied Physics Letters 52, 1179 (1988)), which is a requirement for applications such as superconducting motors, generators, and magnets. Much higher critical current densities ($10^6$A/cm$^{-2}$ at 77K for YBa$_2$Cu$_3$O$_x$) are obtained (Materials Research Society Symposium Proceedings 99, 19 (1988)) for crystallite-oriented films than are obtained for the corresponding crystallite-unoriented bulk superconductor at the same temperature (10-10$^3$ A/cm$^2$). Crystallite orientation can also improve the mechanical and thermal durability of the superconducting films, which in use are typically subjected to both large temperature changes and high mechanical stresses during application.

Several approaches are useful for obtaining crystallite orientation for the superconductors resulting from the electroplating process. In a first approach, the electroplating process or a subsequent recrystallization or annealing process are utilized to provide crystallite orientation for the precursor metal alloy. Oxidation of this oriented precursor can, in preferred cases, result in the oriented superconductor. In a second approach, crystallite orientation is achieved during the oxidation of the precursor alloy into the oxide superconductor. In a third approach, crystallite orientation is achieved by appropriate treatment of the ceramic film, as by melting followed by solidification, annealing or working. Such melting and resolidification processes are broadly defined to include the growth of oriented-crystallite superconductor by dissolution and resolidification from a molten flux (such as copper oxide, which can be conveniently formed using an excess of copper in the electrodeposition substrate or in the electrodeposited metal mixture). The high temperature annealing or the melting-resolidification (recrystallization) step transforms the deposited superconductor into an oriented crystallite layer. For superconducting oxides which have low stability in the molten state, pulsed laser heating, pulsed resistive heating, or heating using a moving laser beam is preferably employed for the melting-recrystallization of the superconducting ceramic to obtain preferential crystallite alignment.

The same type of physical processes can be used to obtain crystallite orientation for each of these approaches. In one extreme, a substrate can be used which provides for true epitaxy during either electrodeposition, oxidation, or resolidification processes. By true epitaxy, we refer to a substrate whose two-dimensional space group and axial dimensions match that of the superconductor. However, it is not necessary to go to this extreme in order to obtain crystallite orientation for the superconductor. Several issues are important here. First, the existence of a planar substrate can by itself be sufficient for preferential formation of the superconductor with its most rapid growth direction parallel to the substrate. In addition, any anisotropy in the substrate deposition surface can be reflected in preferential orientation of the rapid growth direction within the substrate plane.

Many of the substrates on which epitaxial growth of the superconductors is possible are insulators. One example is $SrTiO_3$, which has previously been used to obtain (by electron beam evaporation and oxidation) epitaxial growth of $YBa_2CuO_{7-x}$ having a critical current in excess of $10^5$ A/cm$^2$ at 77K (Physical Review Letters 58, 2684–2686, 1987). In order to use such insulating substrates effectively in the present process, two different methods can be employed. In the first method one constituent metal component in the superconductor is applied by conventional methods, such as chemical deposition or evaporation. Using this conductive layer, the electrochemical deposition of the remaining metal components of the superconductor oxide can be conveniently accomplished. Alternately, substrates for epitaxy which are insulating and photoconducting can be employed if irradiation is used to generate a useable photocurrent.

Further crystallite orientation for the superconducting ceramic can also be achieved. This is to develop parallel grooves on the deposition substrate. Such grooves can inhibit crystal growth in any direction other than parallel to the grooves, so that the rapid-crystal-growth direction becomes oriented in the direction of the grooves.

Another strategy is to melt and resolidify the superconductor at a moving interface, such as in Bridgman, Czochralski, or edge-defined crystal growth. This melting and resolidification can be accomplished using either conventional conduction or convection heating, microwave heating, or laser beam heating, preferably using a $CO_2$ or a Nd:YAG laser.

Electrochemical deposition on conducting fibers or wires such as graphite or copper, followed by oxidation to form the superconducting ceramic, also generally results in preferential orientation of the superconducting ceramic. In this case, the most rapid growth direction for formation of the superconducting oxide is typically preferentially oriented parallel to the fiber direction.

Mechanical processing (either prior to oxidation, during oxidation, or following oxidation to form the superconducting ceramic) can also be usefully employed to obtain preferential crystallite orientation or to change preexisting crystallite orientation. Orientation of film or fiber depositions of the precursor metal mixture or the ceramic oxide can involve a uniaxial or biaxial draw step, or mechanical deformation of a film by shearing it between opposed rollers. The Bi—Sr—Ca—Cu—oxide superconductors and related compositions are particularity preferred for such mechanical alignment processes because of the clay-like texture of these compositions. In addition, mechanical drawing of high viscosits molten oxides can be used to provide a crystallite-oriented superconductor, by means analogous to those utilized in polymer processing.

It is often convenient, because of the brittle nature of specific superconducting ceramics, to utilize an intermediate mechanical process between the electrochemical deposition step and the oxidation steps, which may involve mechanically forming the electroplated substrate, such as wire or sheet, into the shaped form required for application, such as a magnet, transformer, or electrical generator core.

The invention further relates to a superconducting film on a substrate made in accordance with the method of the invention.

Although the invention has generally been discussed with respect to the yttrium or europium, barium, copper 1-2-3 composition, it is clear that this electrodeposition technique and later oxidation can be applied to other superconducting compositions such as, for example, that disclosed in copending application Ser. No. 097,994, filed Sept. 17, 1987 referred to as the 3-3-6, yttrium, barium, copper composition, and $Tl_2Ba_2Ca_1Cu_2O_x$ and $Tl_2Ba_2Ca_1Cu_3O_x$ compositions.

BRIEF DESCRIPTION OF THE DRAWINGS

Having briefly described the invention, the same will become better understood from the following detailed discussion, taken in conjunction with the drawings wherein.

DETAILED DESCRIPTION OF THE INVENTION AND OF THE PREFERRED EMBODIMENTS

Figure 1:
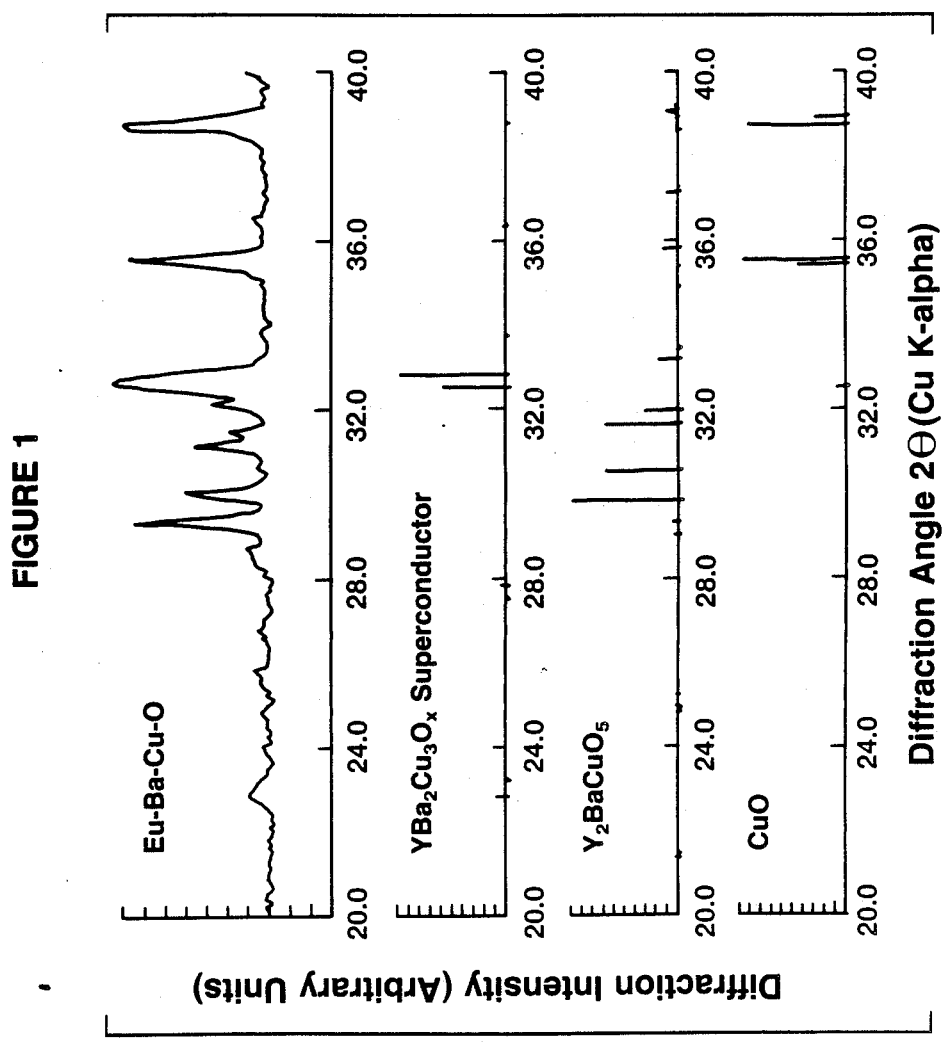
FIG. 1 is a comparison of the X-ray diffraction pattern of a film deposited from a DMSO solution of Eu(NO$_3$)$_3$, Ba(NO$_3$)$_2$ and Ca(OCOCH$_3$) after oxidation thereof (top) with the x-ray diffraction pattern previously established for a superconducting phase of Eu—Ba—Cu—O and two impurity phases ($Y_2BaCuO_5$ and CuO)

The present invention process involves the steps of, (1) electrodepositing a metal layer of appropriate composition simultaneously from a single electrolyte, (2) oxidizing the metal layer, as by heating it in an oxygen-containing atmosphere, to form the superconducting ceramic, and (3) effecting crystallite orientation in the superconducting ceramic. Crystallite orientation may be achieved in the course of the electrodeposition step, by means of treatment of the electrodeposited metal layer, in the course of the oxidation of the metal layer, or by treatment of the superconducting ceramic following oxidation of the metal layer.

Exemplary metal mixtures which can be formed, oxidized and oriented in accordance with the present invention include mixtures of: Eu or Y, Ba, and Cu in a 1-2-3 ratio; Bi, Sr, Ca, and Cu in a 1-1-1-2 ratio; and Tl, Ca, Ba, and Cu in a 1-1-1-2 or 2-2-2-3 ratio.

Typically, the electrodeposition is conducted at room temperature from a liquid electrolyte comprised of salts of the metals dissolved in an aprotic solvent by applying a voltage across the substrate and counter-electrode such that the substrate is held at a constant potential of about $-3$ to about $-6V$ versus a Ag/Ag+ reference electrode. Salt concentrations are adjusted to account for the relative deposition rates of the different cation species. For example, Y, Ba, and Cu are deposited in a ratio of 1-2-3 onto an In-Sn oxide film on quartz substrate when a potential of about $-5$ V versus Ag/Ag+ is applied to the substrate immersed in a DMSO solution that is about 0.1 M in $Y(NO_3)_3$, about 0.27 M in $Ba(NO_3)_2$, and about 0.05 M in $Cu(OCOCH_3)_2$. As a second example, Bi, Sr, Ca and Cu are deposited onto a Pt substrate when a like potential is applied to the substrate immersed in a DMSO solution that is about 0.02 M in $Bi(NO_3)_3$, about 0.1 M in $Sr(NO_3)_2$, about 0.092 M in $Ca(NO_3)_2$ and about 0.025 M in $Cu(OCOCH_3)_2$. After passage of about 0.1 to about 40 coulombs/cm$^2$ for typical films having thickness of about 0.1 micron to about 40 micron, i.e., 1 micron per coulomb, the substrate with deposited film is removed, rinsed in fresh solvent, and dried.

Since the electrodeposition process can function as a purification step to eliminate undesireable impurities in the metal salts, our process for forming the superconductors can effectively utilize less pure precursors than can alternate fabrication techniques for thin film formation, such as sputtering.

Once it is confirmed (by appropriate analysis, as is conventional) that the deposit consists of the selected metals in the proper proportions, the substrate with the metal deposit is then heated in an oxidizing atmosphere (desirably pure oxygen) at a temperature and for time sufficient to oxidize the deposited metals into the superconducting ceramic state. The oxidation step involves conventional procedure. Typical temperatures employed are in the range of about 850°–900° C., with oxidation times in the order of a few minutes to several hours, typically 5 to 30 minutes. Completion of oxidation can be confirmed by x-ray diffraction, as is conventional. In most instances it is desirable to bring oxidation to substantial completion, otherwise phase separation may result.

Figure 4:
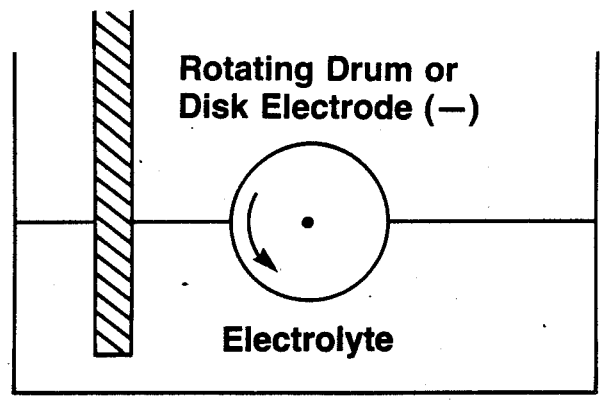
FIG. 4 is a schematic diagram of two continuous electrochemical processes.
Figure 4B:
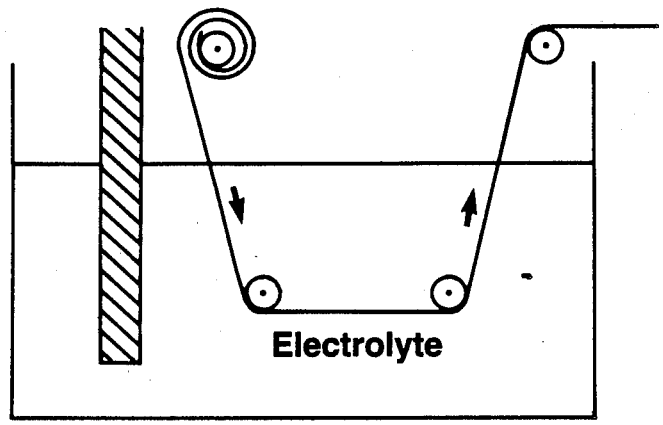

The above-described deposition procedure can also be employed to produce patterned superconducting films. For example, electrical circuits and other objects containing semiconductors, insulators, or conductor elements with superconducting paths may be formed by this method in combination with conventional lithography or in combination with photoinduced enhancement of electrodeposition. Such combinations can be particularly useful in forming parallel arrays of superconducting wires and dots such as those useful as high efficiency transparent shields of electromagnetic radiation. For applications in which high spatial resolution is not required for the superconductor elements of a circuit or array, patterned superconductor films can arise from electrodeposition using patterned counterelectrodes. As a further refinement, the procedure can be employed in a continuous manner using continuous substrates configured, for example, about a "rotating drum" or rotating belt cathode (see FIG. 4).

Selective area electrochemical deposition of the superconductor precursor alloys can be conveniently accomplished using a modification of the lithography techniques conventionally employed to form circuits of metallic and semiconducting elements. An insulating photoresist is deposited (for example, by solution or gas deposition) on the electrode substrate. In one embodiment, a positive photoresist is made insoluble or nonvolatile as a consequence of selected area irradiation, so the substrate conducting electrode is later revealed (after solvent or thermal treatment) only in those regions of the electrode where the photoresist has not been irradiated. Since only the nonirradiated regions of the electrode are not insulating, only those regions undergo deposition of the alloy upon electroplating. Alternately, the irradiation process can lead to either enhanced solubility or volatilization of the irradiated regions of the photoresist. In the former case, solvent treatment of the irradiated electrode can be used to expose the conductor surface only at irradiated regions of the photoresist. Upon subsequent electroplating, the superconductor precursor alloy forms only on portions of the electrode where the insulating layer of photoresist has been removed.

The metal alloy composition which is precursor to the superconductor can also be electrochemically deposited in a patterned form on an electrode using photoinduced enhancement of electrochemical deposition. For this purpose, the most convenient photon source is a high energy laser which is scanned across the electrode surface to generate the patterned alloy deposition. Depending upon the selected photon frequency, the electrolyte, and the target electrode surface, the mechanism of the photoenhanced electrochemical deposition varies. For example, relatively low photon fluxes can be used to generate photocarriers in a photoconductor present at the electrode surface. The resulting current flow through the photoconductor then generates the patterned alloy deposition. Alternately, the photon source can provide patterned alloy deposition by selective volume heating of either the electrolyte or the electrode surface, so as to provide increased current flow at points of irradiation. High temperature oxidation and thermal annealing transforms the patterned alloy deposition into a patterned superconductor deposition. Patterned deposition on a photoconductor surface can also result from patterned exposure to penetrating radiation, such as x-rays. Hence, it is possible to generate a patterned deposition of the superconductor on surface areas which are inaccessible to either visible or ultraviolet radiation.

For applications in which high spatial resolution is not required for the patterned formation of superconductor on a substrate, it is possible to utilize an alternate strategy for patterned deposition. Specifically, the use of a patterned counter electrode or patterned motion of a counter electrode (having dimensions much smaller than the pattern desired on the electroplated electrode) can be used for the electroplating of the precursor superconductor alloy. Note also that segmentation of the patterned counter electrode, so as to provide subunits in the pattern which are at different voltages, provides an additional design feature for the patterned electroplating of the precursor superconductor alloy. This effective segmentation can be either by direct electrical separation or by the use of internal resistive elements. Similarly, use of a counter electrode which undergoes voltage changes during patterned motion provides additional flexibility for the electrochemical deposition of a patterned superconductor precursor alloy.

Modification of the above-described photoenhanced electrochemical deposition can be used to conveniently generate parallel superconducting wires having separations comparable with the wavelength of light. The modified approach utilizes the alternating stripes of intense light and near-zero light intensity resulting from the interference of two light beams. This pattern of illumination generates, via selected area photoenhancement of current flow, the patterned deposition of superconductor precursor alloy. Oxidation of the thereby obtained precursor alloy wires can already provide oriented growth of the superconductor as a consequence of the shape anisotropy of the precursor alloy.

Patterned electrochemical deposition of the superconductor precursor alloy on a transparent electrode substrate, using the above-described methods, permits preparation of an optically transparent superconductor composite. The patterning, such as an array of parallel strips or a two-dimensional dot array of either the superconducting or the superconductor-free areas, provides for optical transparency. Such transparent films can find applications as windows which have extremely high efficiency for the shielding of radio frequency and microwave frequency radiation. Use of a two-dimensional dot array of superconductor can provide for a film which is superconducting in the film thickness direction and insulating in the plane of the film.

The electrode electroplated with the superconductor precursor alloy can be in the form of a moving belt or wire which passes continuously into the electroplating solution and into close proximity to the counter electrode. (Passage of the wire through the center of a cylindrical counter electrode is preferred in the latter instance.) If desired, the belt (or wire) can then pass from the electroplating solution into a chamber for thermal treatment in an oxygen-containing atmosphere. This thermal treatment in oxygen to provide the high temperature superconductor can employ an oxygen plasma or laser-induced heating. If thick coatings of the superconductor are desired, the belt (or wire) can pass continuously between the electroplating bath and the oxidation chamber. Analogously, thick coatings of superconductor can be formed on a drum-shaped article by rotation of a drum-shaped electrode so that electroplating continuously occurs on the side of the drum which is immersed in the electroplating solution. The opposite side of the drum can be continuously laser heated in an oxygen-containing atmosphere to transform the metal alloy into a superconductor. Similarly, electrodeposition can be on a disk shaped counter electrode which is continuously rotated, so as to expose a continuously varying surface of the disk to the electroplating process.

The rotating drum method can be employed for the direct fabrication of a spiral-like wind of superconducting and insulating sheets. Upon near completion of a 360° deposition of the superconducting layer, processing conditions can be changed so that near 360° deposition of an insulator is applied. Alternation of the processing conditions which result in the insulator and the superconductor, so as to maintain continuity in the superconductor sheet, results in the winding of the magnet. The changes in processing conditions can correspond to changes in the applied electrochemical potential, changes in the composition of the electrochemical bath, and/or changes in the heat treatment environment, so as to result in the change from formation of superconductor to formation of insulator. Alternately, the insulator layer can be applied by more conventional routes, such as sputtering a layer of insulating oxide.

In contrast with the conventional technology of forming thin films by sputtering, the electrochemical approach is well suited for deposition of the superconductor precursor alloy on complicated shapes and interior surfaces of articles. For example, the precursor alloy to the superconductor can be deposited on the inside surface of a pipe by filling the pipe with electrolyte, centrally located the anode in the pipe, and utilizing the inner surface of the pipe as the cathode for electrochemical deposition. Tranformation of the precursor alloy into the superconductor is then conveniently accomplished by heat treatment of the pipe in an oxygen-containing atmosphere.

The third essential processing step of the invention method involves orienting the crystallites in the ceramic superconductor. It is to be understood that orientation need not be complete to gain the beneficial effects thereof, but that any degree of orientation is beneficial, with lesser degrees providing lesser benefit and, conversely, maximum obtainable orientation providing maximum benefits. By orientation, as used herein, we refer to any discernible degree of orientation which manifests itself in an increase in critical current density.

As previously stated, orientation can be achieved (1) in the electrodeposition step (2) by means of treatment of the electrodeposited metal layer: (3) in the oxidation step for the metal layer to form the ceramic superconductor: and (4) by treatment of the ceramic superconductor following the oxidation step. Of course, a combination of these procedures can advantageously be employed.

The same type of mechanical deformation processes can generally be employed to directly achieve crystallite orientation of the precursor electroplated metals, the oxidizing metal mixture, or the resulting superconducting ceramic. Since these materials sometimes have low ductility, and the superconducting ceramics are typically brittle, the most generally employable deformation processes utilize compression and/or shear stresses. Such stresses are preferably applied by passing the material, such as a ribbon of the superconducting ceramic, through a system of counter rotating rollers of the type conventionally employed for metal processing. Alternately, a conventional pressing or stamping process can be employed to achieve crystallite orientation with respect to the ribbon or film plane. In either case the applied mechanical stress is desirably sufficient to decrease the thickness of the material to be oriented to between about 0.9 and 0.2, preferably to between about 0.7 and 0.3, of the initial thickness.

It is convenient to employ mechanical stretching in order to achieve a high degree of crystallite orientation for materials which are ductile in the temperature range chosen for the mechanical deformation process. The final length after deformation is desirably about 1.1 to 5 , preferably about 2 to 4 times the initial length for such mechanical processing. Such mechanical draw can be conveniently introduced in a continuous process for wire or tape production using the same types of mechanical designs as used commercially for drawing polymer fibers and tapes. The use of a nonsuperconducting binder material such as silver, which can be electrodeposited with the metal constitutents of the superconductor, can be used to enhance plasticity.

The choice of temperature for the deformation process and whether or not mechanically-induced crystallite alignment is provided during the oxidation step results from evaluation of several factors, relating in part to the cost of processing. For phases and substrate materials which have high thermal stability, deformation temperatures up to the melting point (typically 600°–1200° C.) can be employed. The advantage of using such high temperature is an increase in plasticity, with the benefit that high deformation rates can be employed without the occurrence of fracture. Additionally, high temperatures facilitate sintering and grain growth which can have advantageous effects on properties. The disadvantage of high temperature mechanical processing is in the cost of such processing and the possibility for certain compositions of undesirable chemical side reactions.

It is generally preferable to introduce crystallite orientation directly by mechanical deformation of the superconducting ceramic, rather than by using mechanical deformation to producing crystallite orientation in either the precursor metal mixture or the oxidizing metal mixture. There are several reasons for this choice. First, the precursor metal mixture typically consists of more than one phase. Hence, the oxidation product tends to contain imperfectly oriented crystallites unless substrate effects result in crystallite orientation during oxidation. In the preferred case in which this precursor metal deposition is single phase and oriented with respect to the substrate, crystallographic equivalence of several directions in the deposited metal alloy can exist which can result in structural disorder in the resultant superconducting alloy. Also, the oxidation reaction typically proceeds as a two-phase reaction which does not fully replicate the crystallite orientation of the precursor metal alloy. Whether or not the oxidation reaction of the oriented metal mixture to produce the superconductor retains the desired degree of crystallite orientation depends upon the composition of this mixture and is readily determined using diffraction measurements of crystallographic orientation, as well as direct measurements of orientation-dependent physical properties, such as critical current at specified applied magnetic fields. Combinations of preoxidation, during-oxidation, and post-oxidation mechanical deformation processing can be employed both to result in shaped articles and desired crystallite orientation.

The achievement of a degree of crystallite alignment during oxidation to form the superconducting ceramics or during melt recrystallization of such ceramics occurs without need for special requirements for thin films on a planar substrate or for thin wires of the superconductor. This effect can be purely geometric: even though nucleation of the superconductor might occur with random orientation, the presence of the substrate plane or the limited dimensions orthogonal to the wire axis results in preferred orientation of the rapid-growth-direction in the plane of the substrate or parallel to the wire axis. Although the existence of such preferred orientation is rather insensitive to processing conditions, the degree of crystallite orientation is enhanced for thin films or wires. Consequently, film thicknesses and wire diameters of less than 10 $\mu$ are preferred in order to maximize crystallite alignment. The same considerations pertain for obtaining oriented crystallites as a consequence of melt recrystallization of the metal mixture which is precursor for the superconducting ceramic.

The substrate for recrystallization is preferably one which has a similar cohesive energy density as the material to be recrystallized (superconducting ceramic or precursor metal mixture). Such energy match provides for wetting of the substrate, which is favorable for recrystallization to form uniform films or wires having oriented crystallites. Matching the periodicity of the substrate plane with that of a preferred growth plane of the superconducting ceramic provides optimal conditions for epitaxial growth of the superconducting ceramic.

The temperature of oxidation or resolidification processes is preferably held close to, respectively, the lowest temperature and the highest temperature (i.e., closest to the melting temperature) at which such processes occur at acceptable rates, since slow kinetics of nucleation provide enhancement of crystallite orientation effects. However, higher temperature oxidation or lower temperature recrystallization can be chosen for several reasons, either to increase processing rates or to decrease chemical reactions which provide products other than the desired superconductor. For this reason, for example, it is sometime desirable to employ rapid laser heating and subsequent rapid thermal quench or pulsed electrical heating in order to cause recrystallization of the superconducting ceramic. Because of loss of oxygen from superconducting ceramics during recrystallization processes, such recrystallization processes are preferably conducted in an oxygen-containing environment for superconducting ceramics which readily lose oxygen, such as $YBa_2Cu_3O_x$. In addition, post recrystallization annealing in oxygen is sometimes required in order to enhance superconducting properties, which is the case for $YBa_2Cu_3O_x$ (Applied Physics Letters, 943–945 (1987)).

It is well known in the art that annealing the high temperature superconductors at temperatures less than the melting temperature can result in desirable crystallite growth. Mechanical working of the superconducting ceramic by the methods described above can be used to enhance this crystallite growth.

Typical substrates for achieving the highest degree of crystallite orientation during oxidation and recrystallization are yttria stabilized zirconia, strontium titanate, sapphire, and MgO (Applied Physics Letters 51, 861–863 (1987) and 52, 72–74 (1988)). For substrates which are insulators, one of the components in the metal mixture which is precursor to the superconducting oxide can be applied by chemical or vapor deposition methods, so as to provide the conductor required for electroplating. The best choice of substrate for a particular superconducting ceramic depends upon the structure of that ceramic and can be judged by methods well known in the art.

Having generally described the invention, the following examples are intended to be illustrative but not limiting in any manner.

EXAMPLE I

Figure 2:
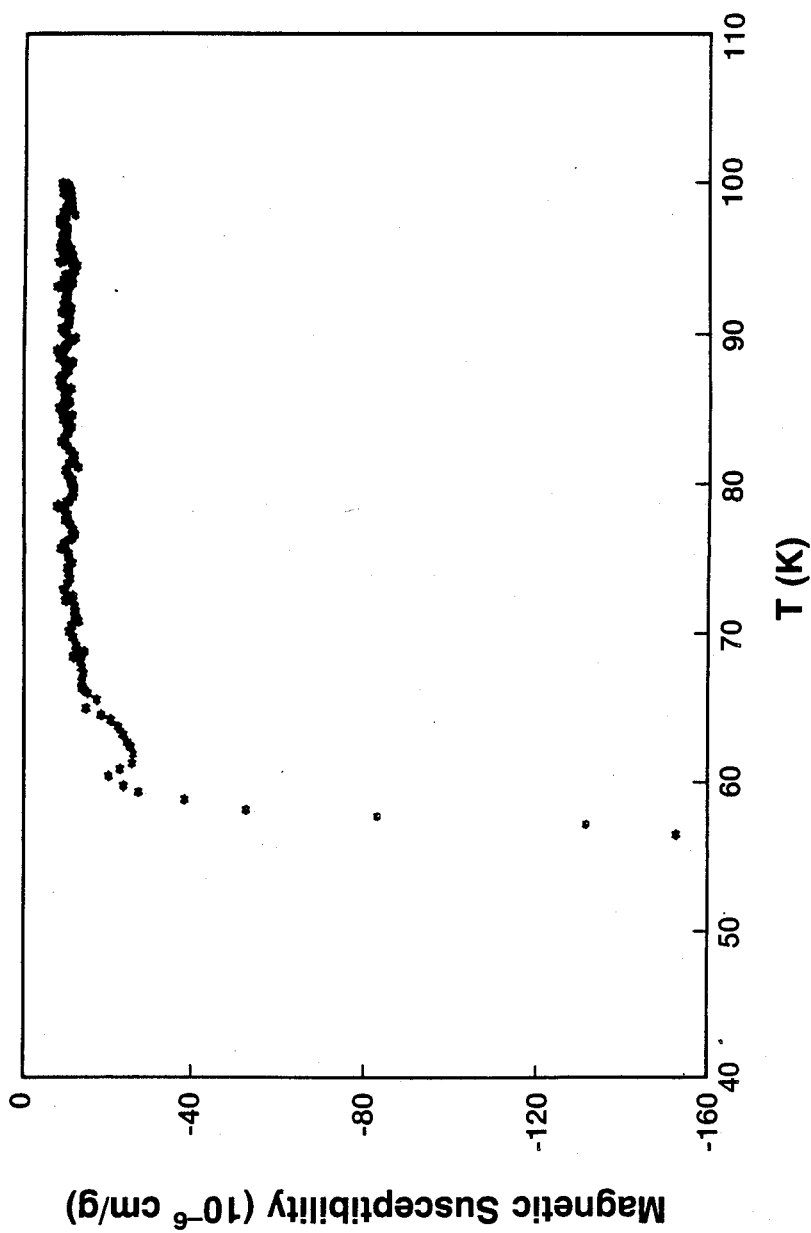
FIG. 2 is a magnetic susceptibility graph as a function of temperature of $EuBa_2Cu_3O_{7+x}$ formed by oxidation of an electrodeposited mixture of Eu, Ba and Cu.

Europium, barium, and copper were codeposited by electrodeposition onto a platinum foil electrode in a molar ratio of 1-2-3. The platinum foil electrode, a copper counter electrode, and a Ag/Ag+ reference electrode were immersed in a dimethylsulfoxide solution that was 0.1 M in $Eu(NO_3)_3$, 0.27 M in $Ba(NO_3)_2$, and 0.051 M in $Cu(OCOCH_3)_2$. A constant potential of $-5.0$ V versus the Ag/Ag+ electrode was applied to the platinum electrode and a deposit formed on the platinum electrode. After 11 coulombs/cm$^2$ had passed, the platinum electrode was removed, rinsed in fresh DMSO and dried A portion of the deposition was shown by electron microprobe analysis to be composed of Eu, Ba, and Cu in the approximate ratio 1-2-3. A second equivalent portion was heated to about 900° C. for about 15 min in an atmosphere of dry oxygen to yield a gray-black film in place of the deposited metals. This film exhibited an x-ray diffraction pattern identical to that of previously synthesized superconducting ceramic $EuBa_2Cu_3O_{7+x}$ (FIG. 1). In FIG. 1 all of the peaks can be assigned to either the 1-2-3 phase (shown for $EuBa_2Cu_3O_{7+x}$) or to the impurity phases $Eu_2BaCuO_5$ (known as the "green phase") and copper oxide. Magnetic susceptibility measurements of the black film indicated a superconducting transition at 60° K. (FIG. 2).

When the platinum foil carrying the black film of superconducting ceramic is subjected to deformation by passing it between a pair of counter-rotating rollers, crystallite orientation in the ceramic layer is achieved, with corresponding increase in the critical current density.

EXAMPLE II

Figure 3:
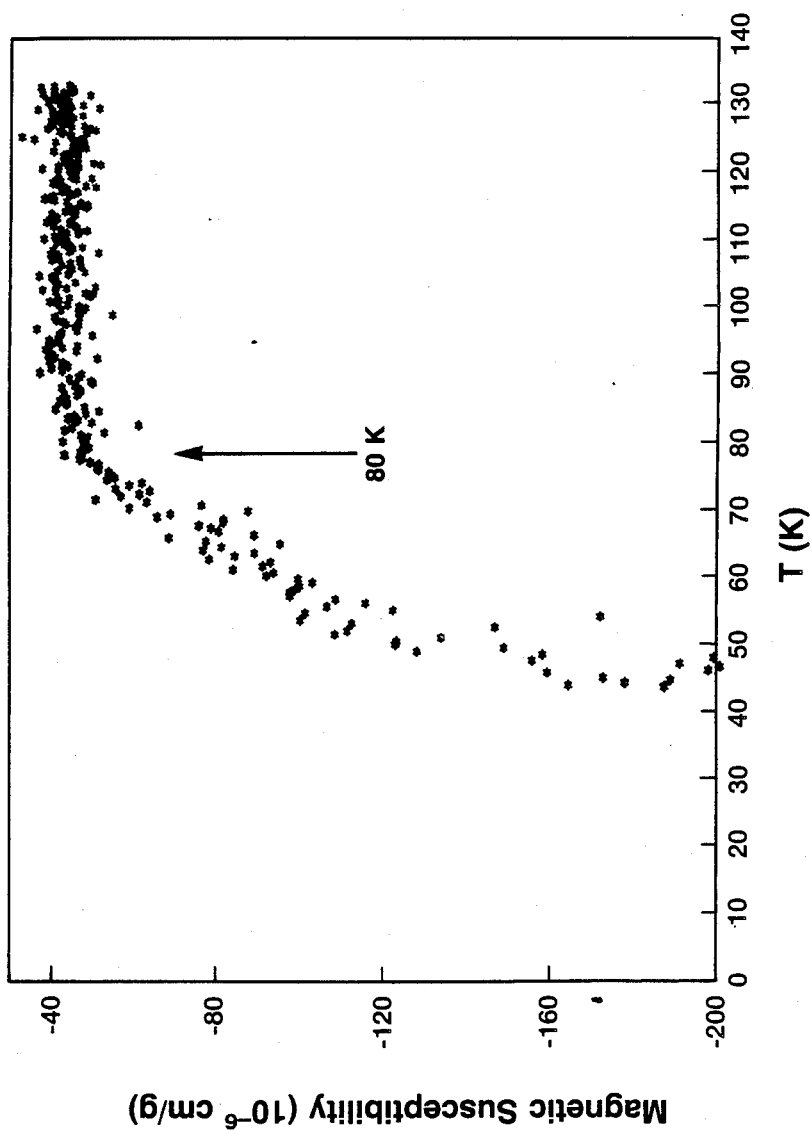
FIG. 3 is a magnetic susceptibility graph as a function of temperature of the oxidized Bi, Sr, Ca and Cu-containing film of Example II herein.

Bismuth, strontium, calcium and copper were codeposited onto a platinum foil electrode in a ratio of 0.2-0.2-1-2 following the procedure outlined in Example I. Ten coulombs were passed while a potential of $-4V$ vs a $Ag/Ag^+$ reference electrode was applied to the platinum electrode while the substrate was immersed in a DMSO solution of 0.02 M $Bi(NO_3)_3$, 0.1 M $Sr(NO_3)_2$, 0.092 M $Ca(NO_3)_2$, and 0.025 M $Cu(OCOCH_3)_2$. A smooth film comprised of tightly packed micro spheres resulted, each sphere consisting of the four elements. The film was then oxidized to the superconducting ceramic by heating in a dry oxygen atmosphere at 850° C. for 15 minutes. Magnetic susceptibility measurements of the oxidized film on Pt indicated a superconducting transition at 80° K. (FIG. 3).

When the platinum foil carrying the black film of superconducting ceramic is subjected to deformation by passing it between a pair of counter-rotating rollers, crystallite orientation in the ceramic layer is achieved, with corresponding increase in the critical current density.

EXAMPLE III

Yttrium, barium and copper were codeposited by electrodeposition onto a platinum foil electrode in a ratio of 1:2:3. The platinum foil electrode and a copper counter electrode were immersed in a dimethylsulfoxide (DMSO) solution of 0.021M $Y(NO_3)_3$, 0.057M $Ba(NO_3)_2$, and 0.001 M $Cu(OAc)_2$. A constant potential of $-4.0V$ to $-5.0V$, as compared to a silver wire reference electrode, was applied to the platinum foil electrode and a deposit was formed on the platinum electrode. After 10 coulombs/cm$^2$ had passed (approximately 20 minutes), the platinum electrode was removed, rinsed in fresh DMSO and dried and analyzed by the electron microprobe technique. The analysis indicated that the deposit consisted of Y, Ba and Cu in the ratio of roughly 1:2:3. The electrode thereafter was heated to about 900° C. for about 5 minutes to yield a black film in place of the deposited metals. The black film exhibited an x-ray diffraction pattern identical to that of the previously prior art synthesized superconducting ceramic $YBa_2Cu_3O_{7-x}$.

When the platinum foil carrying the ceramic superconducting deposit is mechanically uniaxially stretched to about 1.2 times its original dimension, as by clamping it in the jaws of an Instron tensile testing machine and stretching it, crystallite orientation in the ceramic layer is achieved, with corresponding increase in the critical current density.

EXAMPLE IV

Yttrium, barium, and copper were codeposited in different ratios, onto conductive indium-tin oxide films supported on quartz, from DMSO electrolytes having different relative concentrations of $Y(NO_3)_3$, $Ba(NO_3)_2$, and $Cu(OCOCH_3)_2$. In each case, the total ion concentration was about 0.05 to about 0.1 M, the potential applied to the substrate was $-5$ V versus $Ag/Ag^+$, and about 2 to about 10 coulombs were passed during electro-deposition. After each deposition, the composition of the deposit was determined by electron microprobe analysis. Representative electrolytes and compositions of their resulting deposits are shown below.

| Electrolyte $Y^{+3}$—$Ba^{+2}$—$Cu^{+2}$ | | | Composite Y—Ba—Cu | | |
|---|---|---|---|---|---|
| 1 | 2 | 1 | 1 | 1.1 | 9.7 |
| 1 | 2 | 0.5 | 1 | 1.4 | 3.1 |
| 1 | 2.8 | 0.5 | 1 | 1.8 | 3.4 |

When the ceramic superconducting layer is subjected to rapid heating and cooling by scanning its surface with a directed beam from a $CO_2$ laser, crystallite orientation in the ceramic layer is achieved, with corresponding increase in critical current density.

EXAMPLE V

Europium, barium, and copper were codeposited in a molar ratio of about 1-2-3 onto the interior surfaces of cylindrical copper tubes having internal diameters of 2, 4, and 6 mm. Each tube was fitted with a copper wire counter electrode held in the axial position of the tube by a porous separator of hydrophylic polypropylene (Celgard ). After filling each tube with the electrolyte of Example I, a potential of $-5$ V versus its copper counter electrode was applied to the tube. In each case, a continuous film covering the internal surfaces of the tubes were formed. Samples of the films scraped from the tubes were shown by microprobe analysis to contain Eu, Ba, and Cu in a ratio of about 1-2-3.

EXAMPLE VI

Bismuth, strontium, calcium, and copper were codeposited onto a carbon mat in a ratio of about 0.2-0.2 - 1 - 2 following the procedure of Example II except that about 100 coulombs per cm$^2$ were passed during electrolysis. A film of the electro-deposited metals covered the carbon fibers. Oxidation of the coated carbon mat by heating at 850° C. for 15 minutes substantially removed the carbon fibers leaving behind a continuous network of ceramic fibers.

EXAMPLE VII

Selected area electrochemical deposition of the superconductor precursor alloys is accomplished by modifying conventional lithographic techniques which are conventionally employed to form circuits of metallic and semiconducting elements. An insulating photoresist is deposited by either solution or gas deposition on the platinum electrode substrate. A positive photoresist is made insoluble by selected area irradiation, so that the substrate conducting electrode is later revealed (after solvent or thermal treatment) in those regions of the electrode where the photoresist has not been irradiated. Thereafter, the electrode is electro-deposited as in Example I and only those regions, i.e., the non-irradiated regions of the electrode which are not insulating, undergo deposition of the alloy or metals upon electroplating. Thereafter, the oxidation is conducted in accordance with Example I.

EXAMPLE VIII

A metal alloy composition which is precursor to the superconductor of Example I, is electrochemically deposited in a patterned form on an electrode using photo-induced enhancement of electrochemical deposition. The photon source is a high energy laser which is scanned across the electrode surface to generate the patterned alloy deposition. The selected photon frequency, electrolyte, electrode potential and target electrode surface is varied to control the rate of the photo-enhanced electro-chemical deposition to a predetermined value. Thereafter high temperature oxidation, i.e., at about 900° C., and thermal annealing, at about 650° C. is employed to transform the patterned alloy deposition into a patterned superconductor film.

EXAMPLE IX

The method of Example V is modified to generate parallel superconducting wires having separations comparable with the wavelength of the light employed in the photo deposition. The approach utilizes alternating stripes of intense light and near zero light intensity resulting from the interference of two light beams appropriately positioned. The patterned illumination generates, through selected area photo-enhancement of current flow, the patterned deposition of superconductor precursor alloys. The oxidation of the thereby obtained precursor alloy wires provides oriented growth of the superconductor during oxidation as a consequence of the shape anisotropy of the precursor alloy. This preferred growth improves the properties of the superconductor with the oxidation being accomplished, into the superconducting state, in accordance with the method of Example I.

EXAMPLE X

Deposition of the superconductor precursor alloys on the inside of a metal tube and on the surface of a metal wire is accomplished by electrochemical techniques similar to that described in examples I and II. Thereafter the oxidation to superconducting ceramic is conducted also in accordance with the processes described in examples I and II to give a wire and the inside of a tube coated with superconducting material.

EXAMPLE XI

A sample containing the deposited superconducting composition $Bi_2Sr_2CaCu_2O_x$ on a flat platinum substrate electrode was prepared according to the method of Example II. The approximate unit cell parameters for this pseudotetragonal material were a=4A, b=5.4 A, and c=31A. Substantial orientation of the superconducting crystallites relative to the substrate plane was indicated by comparison of the x-ray diffraction pattern (parafocus geometry) of this sample with that of largely unoriented powder of the same superconductor phase. The intensities of the 001 relections were significantly increased relative to general hkl reflections for the superconductor prepared by electroplating on the planar electrode surface. For example, the 105 reflection was the strongest diffraction line for the largely unoriented powder and had an intensity more than two times that of the 008 reflection. In contrast, the intensity of the 105 reflection was less than or equal to that of the 008 reflection in the sample prepared by the electrochemical process. These changes in relative intensities indicate that the (001) plane of the superconducting phase was preferentially oriented parallel to the substrate plane.

The superconducting ceramic layers made by the process of the present invention are eminently suitable for fabrication into bulk superconducting composites, comprised of superconducting wire, fibers, or tapes compounded together. Desirably, these composites are in the form of composite wires, cables or tapes. These cables are comprised of several parallel wires held together mechanically, as by compress ion, through annealing, or encasement in a tube, typically a metal tube. Composite tapes can be laminated together to form thick superconducting objects. A particular advantage of these superconducting composite structures is their design flexibility for the fabrication of superconducting objects having various shapes.

Since various changes may be made in the present invention without departing from its scope and essential characteristics, all matter contained in the above description shall be interpreted as illustrative only, the scope of the invention being defined by the appended claims.

What is claimed is:
1. A method of forming crystallite-oriented deposits of superconducting ceramics comprising the steps of:
   (a) Electrodepositing a mixture of metals onto a substrate to form thereon a layer of metals of the type and in proportions sufficient to be oxidized into superconducting ceramic:
   (b) oxidizing said layer of metals by subjecting it at elevated temperature to an oxidizing atmosphere under conditions sufficient to result in a superconducting ceramic deposit: and
   (c) orienting the crystallites in said superconducting ceramic deposit,
whereby there is obtained an increase in the critical current density of the superconducting ceramic.

2. The method of claim 1 wherein crystallites are oriented by melting and resolidifying the electrodeposited metals.

3. The method of claim 1 wherein crystallites are oriented by melting and resolidifying the oxidized superconducting ceramic.

4. The method of claim 1 wherein crystallites are oriented by mechanically deforming the superconducting ceramic during or following the oxidation step.

5. The method of claim 1 in which the electrodeposited mixture of metals contains copper.

6. The method of claim 1 in which the electrodeposited mixture of metals contains both silver and copper.

7. The method of claim 1 in which the electrodeposition of the mixture of metals is made in a patterned array.

8. The method of claim 3 wherein melting and resolidification take place in a moving interface between solidified and molten superconducting ceramic.

9. The method of claim 4 wherein crystallites are oriented by mechanically deforming the superconducting ceramic following the oxidation step.

10. The method of claim 9 wherein the mixture of metals is electrodeposited on an essentially flat, flexible substrate.

11. The method of claim 10 wherein the mixture of metals is electrodeposited on a fiber or wire substrate.

* * * * *